United States Patent [19]
Holst

[11] Patent Number: 6,054,918
[45] Date of Patent: Apr. 25, 2000

[54] SELF-TIMED DIFFERENTIAL COMPARATOR

[75] Inventor: John Christian Holst, San Jose, Calif.

[73] Assignee: Advanced Micro Devices, Inc., Sunnyvale, Calif.

[21] Appl. No.: 08/938,077

[22] Filed: Sep. 26, 1997

Related U.S. Application Data

[60] Provisional application No. 60/027,329, Sep. 30, 1996.

[51] Int. Cl.[7] ................................................ G06F 7/02
[52] U.S. Cl. .................................................. 340/146.2
[58] Field of Search ........................................ 340/146.2

[56] References Cited

U.S. PATENT DOCUMENTS

| | | | |
|---|---|---|---|
| 4,843,339 | 6/1989 | Burt et al. | 330/10 |
| 5,391,938 | 2/1995 | Hatsuda | 340/146.2 |
| 5,471,188 | 11/1995 | Chappell et al. | 340/146.2 |

*Primary Examiner*—Margaret R. Wambach
*Attorney, Agent, or Firm*—Skjerven, Morrill, MacPherson, Franklin & Friel, LLP.; Ken J. Koestner

[57] ABSTRACT

A multiple-bit comparator achieves a fast operating speed and accurate operation through the connection of multiple individual-bit comparison devices to a first line and the connection of a timing device to a second line. The first line and the second line are differentially sensed to generate a signal designating whether all bits match or not. In some embodiments, the replica timing device is timed using a timing signal replicating the application of data to the individual-bit comparison devices and generates a signal on the second line that is delayed in comparison to the multiple-bit comparison signal on the first line by reduced sizing of the timing device in comparison to the individual-bit comparison devices. In some embodiments, a differential comparator includes a sense amplifier that is self-timed rather than utilizing a strobe signal to supply timing. In some embodiments, the sense amplifier includes a cross-coupled device that sources current between differential sides of the sense amplifier. A typical cross-coupled device supports a bias current, consuming power when the circuit is inactive. However, the present sense amplifier includes a precharge switch that stops current drain in the sense amplifier when the amplifier is inactive.

27 Claims, 9 Drawing Sheets

SELF-TIMED DIFFERENTIAL COMPARATOR

CROSS-REFERENCE TO RELATED APPLICATION

This application claims the benefit under 35 U.S.C. § 119(e) of U.S. Provisional Application Ser. No. 60/027,329, filed Sep. 30, 1996, entitled "An X86 Microprocessor with Multi-Media Extensions" and naming Donald A. Draper, Matthew P. Crowley, John Hoist, John G. Favor, Amos Ben-Meir, Jeffery E. Trull, Raj Khanna, Dennis Wendell, Ravikrishna Cherukuri, Joe Nolan, Hamid Partovi, Mark Johnson, and Tom Lee as inventors, which provisional application discloses an exemplary embodiment of the present invention and which is incorporated herein by reference in its entirety.

BACKGROUND OF THE INVENTION

1. Field of the Invention

The present invention relates to comparator circuits. More specifically, the invention relates to a self-timed differential comparator for applications such as performing a fast comparison of multiple address signals.

2. Description of the Related Art

Microprocessor architectures are continually evolving to improve and extend the capabilities of personal computers. Execution speed, power consumption, and circuit size are aspects of microprocessors and microprocessor performance that are constantly addressed by processor architects and designers in the ongoing quest for an improved product. Execution speed not only depends on the clock rate of a processor, but also upon the speed of interfaces such as cache memories and buses that supply instructions and data for execution by a processor core. The execution speed of microprocessors is heavily analyzed and compared using standard benchmark tests for judging the performance of competing entries into the microprocessor market.

In processing circuits such as microprocessors, the comparison of multiple bits is a common and necessary operation but also a time consuming operation. Designs that accelerate multiple-bit comparison operations are continually sought. Timing is a common problem in multiple-bit comparison circuits because variable signal setup times may result depending on the signals that are applied to a comparator.

What is needed is a multiple-bit comparator and operating method that rapidly but accurately compares a multiple-bit signal.

SUMMARY

A multiple-bit comparator achieves a fast operating speed and accurate operation through the connection of multiple individual-bit comparison devices to a first line and the connection of a timing device to a second line. The first line and the second line are differentially sensed to generate a signal designating whether all bits match or not. In some embodiments, the replica timing device is timed using a timing signal replicating the application of data to the individual-bit comparison devices and generates a signal on the second line that is delayed in comparison to the multiple-bit comparison signal on the first line by reduced sizing of the timing device in comparison to the individual-bit comparison devices.

In some embodiments, a differential comparator includes a sense amplifier that is self-timed rather than utilizing a strobe signal to supply timing. In some embodiments, the sense amplifier includes a cross-coupled device that sources current between differential sides of the sense amplifier. A typical cross-coupled device supports a bias current, consuming power when the circuit is inactive. However, the present sense amplifier includes a precharge switch that stops current drain in the sense amplifier when the amplifier is inactive.

Many advantages are achieved by the described comparator circuit and operating method. It is advantageous that the differential comparator includes a self-timed differential amplifier that does not utilize timing signals, thereby simplifying the circuit structure and operation. The differential amplifier advantageously avoids bias current drain. The differential comparator is highly useful in the application of a programmable logic array (PLA).

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

DETAILED DESCRIPTION OF THE ILLUSTRATIVE EMBODIMENTS

Figure 1:
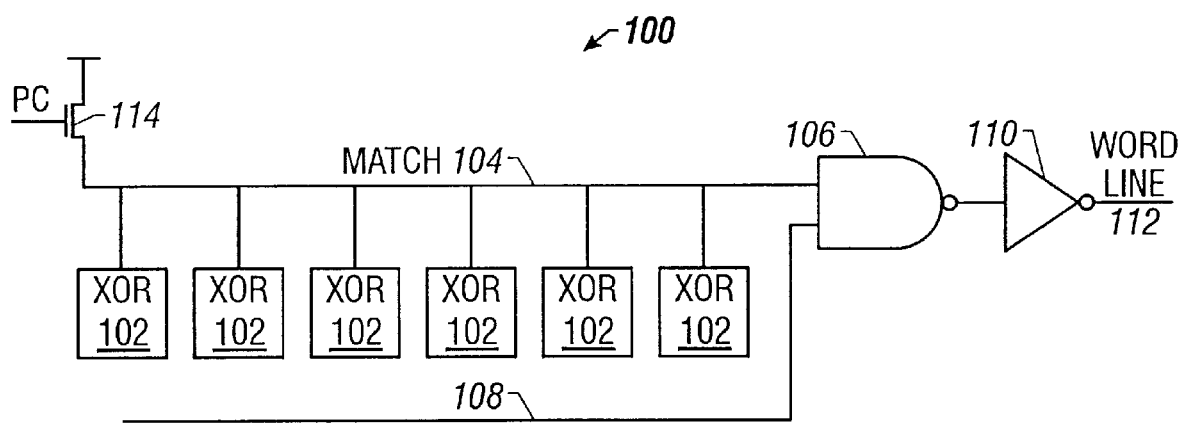
FIG. 1 is a schematic circuit diagram illustrating an embodiment of a comparator that is suitable for usage in an AND array of the programmable logic array (PLA) shown hereinafter in FIG. 6.
Figure 6:
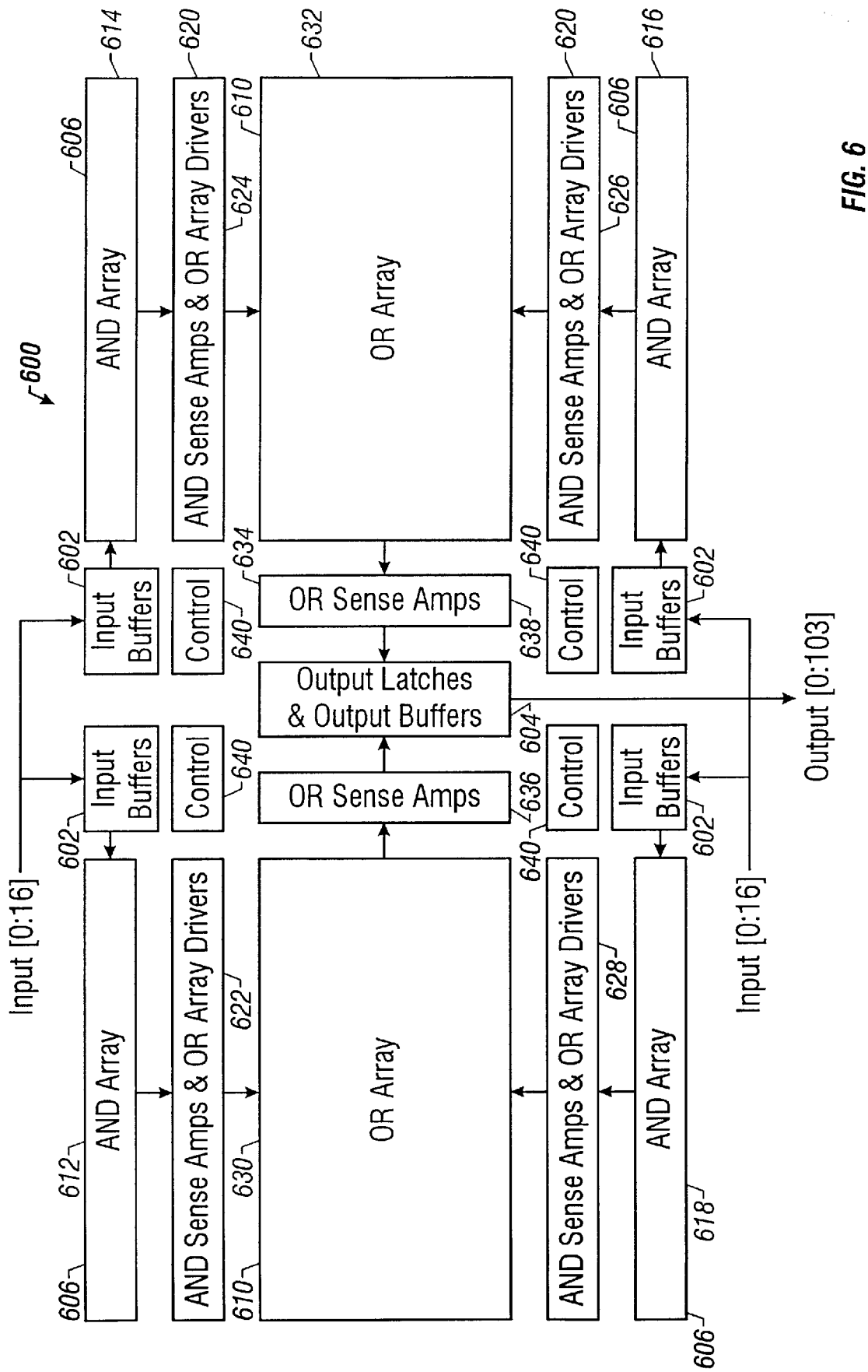
FIG. 6 is a schematic block diagram which illustrates an embodiment of a programmable logic array (PLA) within the microprocessor.

Referring to FIG. 1, a schematic circuit diagram illustrates an embodiment of a comparator 100 that is suitable for usage in an AND array of the programmable logic array (PLA) shown in FIG. 6 for performing a dynamic AND operation. The comparator 100 forms an array row including a plurality of array elements 102, such as exclusive-OR elements, connected to a match line 104. The comparator 100 operates dynamically in the manner of a read-only-memory (ROM) to achieve a fast operating speed. The match line 104 is connected to a first input terminal of a NAND gate 106 while a second input terminal of the NAND gate 106 is connected to a timing line 108 that is driven by a timing signal and is applied among many rows of the array. The output signal of the NAND gate 106 is connected to an inverter 110 that drives a word line 112. A plurality of word lines 112 are called AND-terms or mipterms of a PLA. The match line 104 is precharged through the operation of a precharge switch 114 that is controlled by a precharge signal PC. The match line 104 supplies a single-ended input signal to the NAND gate 106 that is activated by the timing signal which is shared among multiple rows.

The match line 104 is precharged to a "high" state and the timing line 108 is precharged to a "low" state so that if the match line 104 and timing line 108 remain in the precharged state, the output of the NAND gate 106 is high and the word line 112 remains in the low state. Accordingly, during precharge, if the timing signal on the timing line 108 is in a low state, all word line 112 are forced to the low state.

During operation of the PLA, accesses directed to the PLA drive address signals to the exclusive-OR array elements 102 that determine whether the pairs of address bit signals, for example A addresses and B addresses, match. If a pair of address signals do not match, the exclusive-OR array element 102 associated to the address pair discharges the match line 104 to a low state. If a plurality of address signal pairs do not match, a respective plurality of exclusive-OR array elements 102 discharge the match line 104 to a low state. When the timing signal on the timing line 108 goes to a high state, the state of the match line 104 determines the minterm value on the word line 112. If the timing signal goes to the high state when the match line 104 is discharged to a low state, the word line 112 remains in the low state. However, if the timing signal goes to the high state when the exclusive-OR array elements 102 have not discharged the match line 104 indicating no mismatching devices, the word line 112 goes high, activating the minterm (the AND-term).

One problem with the single-ended comparator 100 is that correct functionality depends on the precision of the timing signal with respect to the signal on the match line 104. A precise timing signal is difficult to achieve since the timing of discharge of the match line 104 depends on the number of exclusive-OR array elements 102 that fail to match. A timing signal is typically generated by attempting to replicate the slowest match line delay, a delay resulting from a single mismatch of the exclusive-OR array So elements 102, and buffering this delay to drive the plurality of NAND gates 106 in the PLA.

Another problem with the single-ended comparator 100 is that the match line 104 is loaded with a large number of exclusive-OR array elements 102 so that the fan-out is much greater than optimal, adversely impacting the speed of the match line 104 and therefore the comparator 100.

Figure 2:
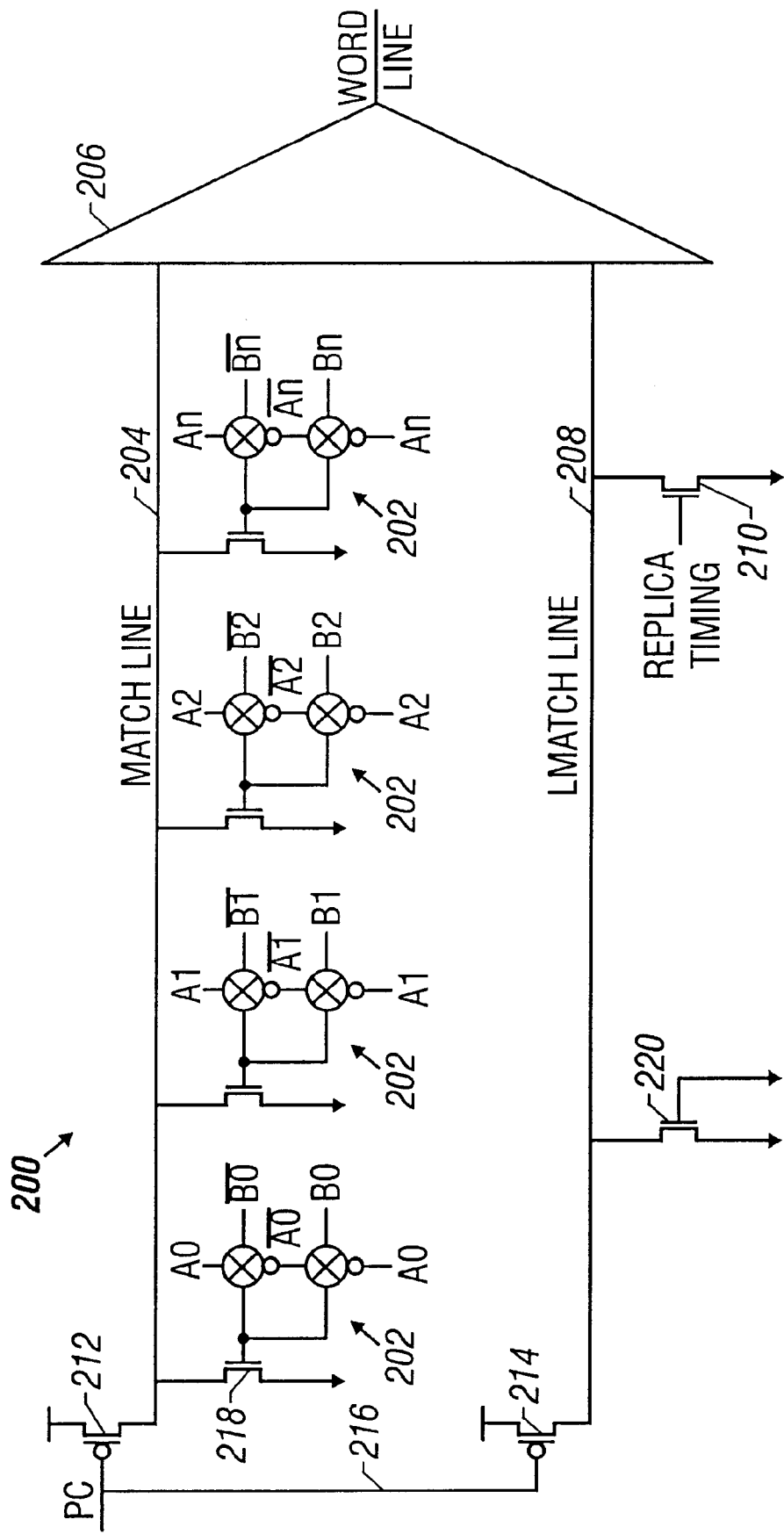
FIG. 2 is a schematic mixed circuit and block diagram showing an embodiment of a differential comparator that is used in applications such as the AND array of the programmable logic array (PLA) shown hereinafter in FIG. 6.

Referring to FIG. 2, a schematic mixed circuit and block diagram of an embodiment of a differential comparator 200 that is used in applications such as the AND array of the programmable logic array (PLA) shown in FIG. 6. The differential comparator 200 is an array row that includes a plurality of exclusive-OR array elements 202 connected to a match line 204. The match line 204 is connected to a plus input terminal of a differential amplifier 206. The minus terminal of the differential amplifier 206 is connected to an lmatch line 208. A replica timing transistor 210 is connected to the lmatch line 208. The match line 204 and the lmatch line 208 are precharged through the operation of respective match and lmatch precharge switches 212 and 214 that are controlled by a precharge signal PC.

The match line 204 and the lmatch line 208 are simultaneously precharged to a high state when activated by precharge line 216 under control of the precharge switches 212 and 214. The plurality of exclusive-OR array elements 202 on the match line 204 are used to compare a first sequence of bits to a second sequence of bits. For example, the exclusive-OR array elements 202 are used in the present example to compare two buses including bits An through A0 and Bn through B0, respectively. Bits An_bar through A0_bar and Bn_bar through B0_bar are generated and applied to the exclusive-OR array elements 202 in combination with the An-A0 and Bn-B0 bits.

For the differential comparator 200, which is a dynamic-type comparator, the address bits are monotonic, starting in a low state and making a transition to a high state to achieve a faster operating speed. For example, bit A0 and inverted bit A0_bar and bit B0 and inverted bit B0_bar are applied to an exclusive-OR array element 202, all signals beginning low and being monotonic. In one embodiment, the exclusive-OR array element 202 includes a single N-channel MOSFET pulldown transistor 218 that is driven by a pair of transmission gates for comparing bit A0 and B0. If bit A0 is not equal to bit B0, indicating a no-match condition, the exclusive-OR array element 202 activates an n-channel MOSFET 218 to discharge the match line 204. A balance transistor 220 is connected to the lmatch line 208 to balance the capacitance of the exclusive-OR array elements 202 on the match line 204. The replica timing transistor 210 is connected to the lmatch line 208 and is activated by a replica timing signal that replicates the timing of the address signals. The exclusive-OR array elements 202 have a width W and the replica timing transistor 210 has a width W/2 that is half the width of the exclusive-OR array elements 202.

When the address signals are applied to the exclusive-OR array elements 202, if one or more bits do not match, the corresponding exclusive-OR array elements 202 discharge the match line 204. The differential amplifier 206 detects the discharged match line 204 and generates a "miss" signal. When all of the bits match, the match line 204 is precharged to a high state and remains high. To assure that a "hit" signal is generated when all of the bits match, the replica timing transistor 210 discharges the lmatch line 208. Thus when the lmatch line 208 is discharged while the match line 204 remains charged, the differential amplifier 206 generates a "hit" signal that is distinguished from simply the lack of a miss condition.

An advantage of the differential comparator 200 is that timing information is inherent to the operation of the circuit so that timing signals may be omitted, simplifying and reducing the circuitry in the differential comparator 200. In some cases the differential sensing without timing is faster than a timed circuit since a decision is made when the differential signals change sufficiently for the differential sense amplifier 206 to detect the variation, rather than upon a full rail signal change. This aspect of differential sensing is further advantageous due to the large number of array elements 202 connected to the match line 204 and thus the large fan-out that slows signals on the match line 204. Since less than a full-rail signal change is sensed by the differential sense amplifier 202, the speed of the differential comparator 200 is increased.

Figure 3:
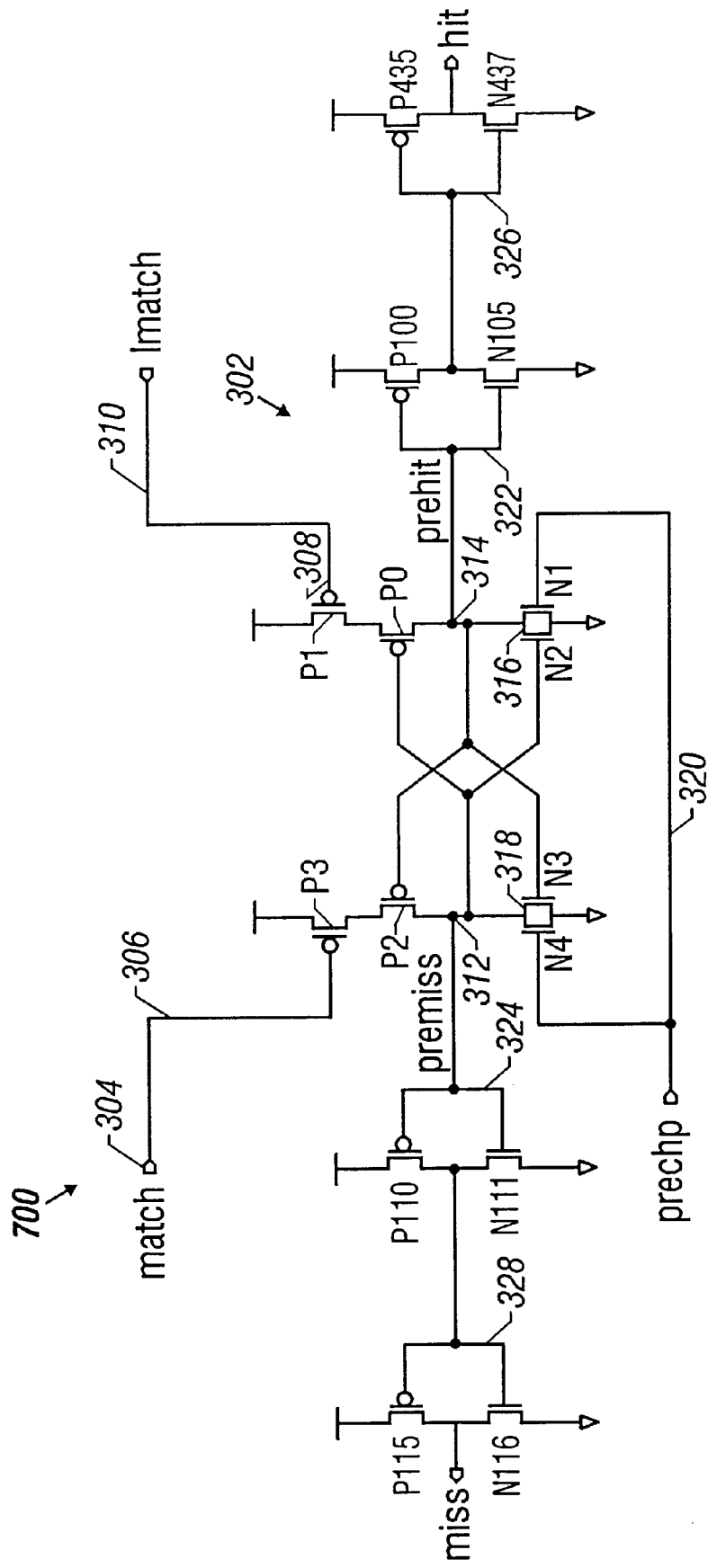
FIG. 3 is a schematic circuit diagram illustrating an embodiment of a differential amplifier for usage in the differential comparator.

Referring to FIG. 3, a schematic circuit diagram illustrates an embodiment of a differential amplifier 302 for usage in the differential comparator 300. The differential amplifier 302 is self-timed, timed without use of a strobe signal, simplifying the structure of the circuit. The differential amplifier 302 has a symmetric, cross-coupled form while including structures that avoid the need for a bias current. Typical cross-coupled structures require biasing so that the illustrative differential amplifier 302 advantageously saves power.

The differential amplifier 302 includes a "true" input terminal 304 connected to a match line 306 and a "complement" input terminal 308 connected to an lmatch line 310. The true input terminal 304 is formed by a true input p-channel MOSFET p3 having a gate connected to the match line 304. The true input p-channel MOSFET p3 is connected to a cross-coupled p-channel MOSFET p2, forming a source-drain pathway from a power source VDD to a premiss node 312. The complement input terminal 308 is formed by a complement input p-channel MOSFET p1 having a gate connected to the lmatch line 310. The complement input p-channel MOSFET p1 is connected to a cross-coupled p-channel MOSFET p0, forming a source-drain pathway from a power source VDD to a prehit node 314. The gate of the cross-coupled p-channel MOSFET p2 is connected to the prehit node 314. The gate of the cross-coupled p-channel MOSFET p0 is connected to the premiss node 312. The differential amplifier 302 also includes a cross-coupled n-channel MOSFET n3 and a cross-coupled n-channel MOSFET n2. The cross-coupled n-channel MOSFET n3 has a source-drain pathway between the premiss node 312 and a ground reference VSS, and has a gate connected to the prehit node 314. The cross-coupled n-channel MOSFET n2 has a source-drain pathway connected between the prehit node 314 and the ground reference VSS, and has a gate connected to the premiss node 312. The cross-coupled n-channel MOSFETs n2 and n3 are sized to a sufficiently large channel width to prevent common-mode operation errors that result when the voltage level of the match line 306 and lmatch line 310 signals are discharged simultaneously, causing both complement input p-channel MOSFET p1 and true input p-channel MOSFET p3 to be active simultaneously. The cross-coupled MOSFETs n2 and n3 prevent spurious high transitions on premiss node 312 and the prehit node 314.

The differential amplifier 302 includes a pair of precharge terminals 316 and 318 for precharging the prehit node 314 and the premiss node 312. The precharge terminal 316 is formed by a precharge n-channel MOSFET n4 having a source-drain pathway connected between the premiss node 312 and the ground reference VSS, and having a gate connected to a precharge line 320. The precharge terminal 318 is formed by a precharge n-channel MOSFET n1 having a source-drain pathway connected between the prehit node 314 and the ground reference VSS, and has a gate terminal connected to the precharge line 320.

A buffer 322 is connected to the prehit node 314 and a buffer 324 is connected to the premiss node 312 to first buffer stage. Both the buffer 322 and the buffer 324 are CMOS logic inverters having a high input impedance in both high and low states, and having no quiescent current. In the illustrative embodiment, a drive buffer 326 is connected to the buffer 322 and a drive buffer 328 is connected to the buffer 324 to form a second buffer stage. The drive buffer 326 and drive buffer 328 are outside stages of the differential comparator 300 that buffer the prehit node 314 and the premiss node 312, respectively, to drive larger loads (not shown). In other embodiments, the second buffer stage or both buffer stages may be omitted or include components that are not inverters, such as logic gates. For any buffer stage configuration, the capacitance at the prehit node 314 and the premiss node 312 are specified to be substantially equal no matter what loads are driven by the nodes.

Figure 4:
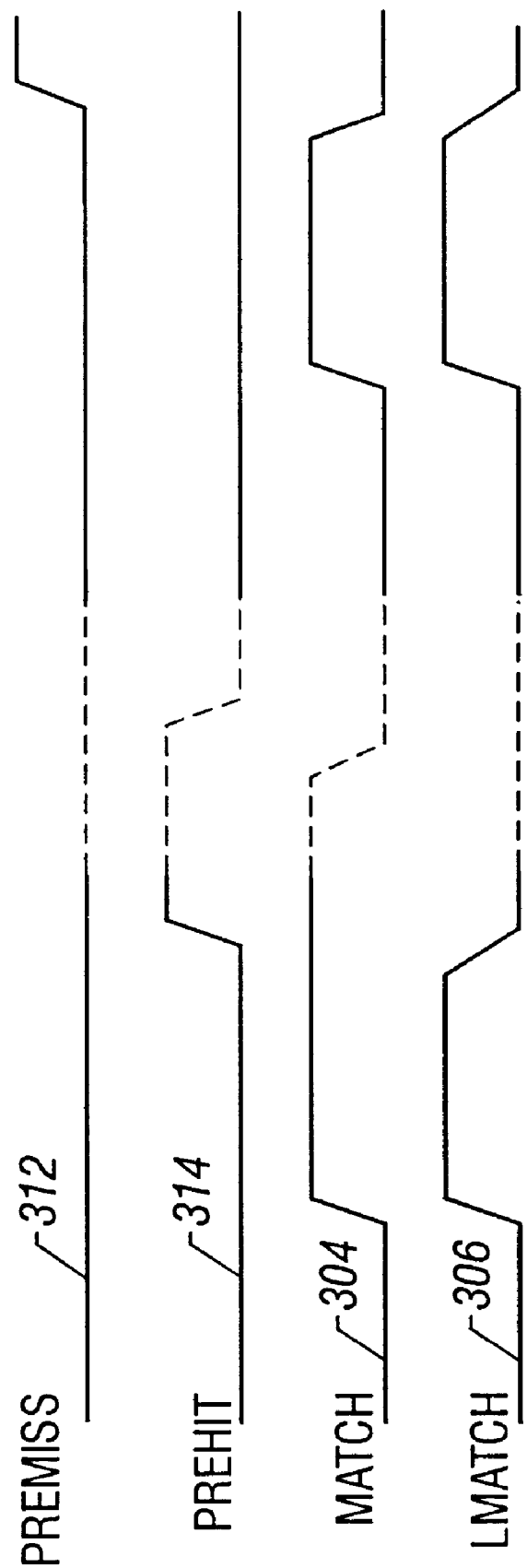
FIG. 4 is a timing diagram illustrating operation of the differential comparator shown in FIG. 3.

Referring to FIG. 4 in conjunction with FIG. 3, a timing diagram illustrates operation of the differential comparator 300. In a quiescent state, a precharge signal on the precharge line 320 has previously passed through an "ON" or "high" state, then through an "OFF" or "low" state so that the premiss node 312 and the prehit node 314 are both discharged to ground (VSS). The ground (VSS) potential is applied to the gates of cross-coupled p-channel MOSFETs p0 and p2 so that both are activated to an ON state. Both the match line 304 and the lmatch line 306 are precharged to an ON or high state so that the high state applied to the gates of complement input p-channel MOSFET p1 and true input p-channel MOSFET p3 so that both are deactivated to an OFF state. The deactivation of complement input p-channel MOSFET p1 and true input p-channel MOSFET p3 advantageously stops bias current in the differential amplifier 302.

Activation of address input signals to exclusive-OR circuit 202 shown in FIG. 2 causes the lmatch line 306 to fall from a high state to a low state as a result of the replica timing that generates pulses every timing cycle. The replica timing activates the half-size replica timing device 202 so that the signal on the lmatch line 306 falls from the high state to the low state with a fixed delay. The match signal on the match line 304 remains in the high state if a match condition occurs but is discharged at least twice as fast as the lmatch signal on the lmatch line 306 because the match line 304 is driven by a full-size device. In addition the match line 304 is connected to multiple full-size devices and potentially driven by each. Every bit that mismatches adds to the drive on the match line 304, increasing the rate of discharge of the match line 304. If only a single bit mismatches, the match line 304 discharges slowest, at a rate approximately twice the discharge rate of the lmatch line 306. If all bits mismatch, the match line 304 typically discharges immediately to ground (VSS).

The differential comparator 300 detects whether the signal on the match line 304 or the signal on the lmatch line 306 falls more rapidly. The first signal that falls a p-channel MOSFET threshold below the power source VDD activates either true input p-channel MOSFET p3 if match line 304 falls first or complement input p-channel MOSFET p1, otherwise. In either case, cross-coupled p-channel MOSFET p0 and cross-coupled p-channel MOSFET p2 are precharged to an ON state when the p-channel MOSFET p1 or p3 are activated.

In the case that the signal on lmatch line 310 is discharged while the signal on match line 304 remains in the high state, complement input p-channel MOSFET p1 is activated so that current flows to the prehit node 314, thereby charging the prehit node 314. Charging of the prehit node 314 deactivates cross-coupled p-channel MOSFET p2 to an OFF state while activating cross-coupled n-channel MOSFET n3 to an ON state. The activation of cross-coupled n-channel MOSFET n3 to an ON state holds the premiss node 312 to the low state, preventing charging resulting from coupling currents in the differential amplifier 302.

Cross-coupled p-channel MOSFET p0 and cross-coupled p-channel MOSFET p2 are highly useful in the case that both match line 304 and lmatch line 306 are discharged. If the signal on the match line 304 is discharged, the discharge is more rapid than the discharge of the signal on lmatch line 306 so that true input p-channel MOSFET p3 is activated prior to complement input p-channel MOSFET p1. True input p-channel MOSFET p3 is activated to the ON state, charging the premiss node 312. The premiss node 312 charges and deactivates cross-coupled p-channel MOSFET p0 to an OFF state. The signal on the lmatch line 306 also discharges, but discharges slowly in comparison to the match line 304 signal so that cross-coupled p-channel MOSFET p0 is deactivated to the OFF state by the time the lmatch line 306 signal reaches a p-channel MOSFET threshold below power source VDD. Although the signal on the lmatch line 306 is discharged to ground (VSS), the differential amplifier 302 is committed to charging the premiss node 312 to the high state and discharging the prehit node 314 to the low state.

The differential amplifier 302 is regenerative. The signals on the match line 304 or the lmatch line 306 may make only partial transitions and the differential comparator 300 will switch states. Once the differential amplifier 302 is committed, the state of the differential comparator 300 is latched until the precharge signal on the precharge line 320 is raised to a high state.

The differential comparator 300 is advantageously self-timed. The differential comparator 300 responds to the voltage differential applied to the match line 304 and lmatch line 306 without invoking an external timing signal to activate the differential comparator 300.

In the illustrative embodiment of the differential amplifier 302, complement input p-channel MOSFET p1, true input p-channel MOSFET p3, cross-coupled p-channel MOSFET p0, and cross-coupled p-channel MOSFET p2 are preferably reasonably well-matched although the differential amplifier 302 is tolerant to a large amount of mismatch and remains operational. For example in the case that the signals on both match line 304 and lmatch line 306 are discharged, when the match line 304 signal reaches a p-channel threshold voltage ($V_{tp}$) less than power source VDD, the signal on lmatch line 306 has reached only half the voltage difference. If $V_{tp}$ is 400 mV, the differential amplifier 302 has 200 mV of signal margin so that a fairly inaccurate transistor matching is possible.

In an alternative embodiment of the differential amplifier 302, complement input p-channel MOSFET p1 is transposed with cross-coupled p-channel MOSFET p0 so that complement input p-channel MOSFET p1 is connected to the prehit node 314. Likewise, true input p-channel MOSFET p3 is transposed with cross-coupled p-channel MOSFET p2 so that true input p-channel MOSFET p3 is connected to the premiss node 312. Performance is slightly different in the alternative embodiment of the differential amplifier 302 with a small increase in switching speed but a slight sacrifice in sensitivity.

In the alternative embodiment, like the embodiment depicted in FIG. 3, the p-channel transistor pair, complement input p-channel MOSFET p1 and cross-coupled p-channel MOSFET p0, and the transistor pair, true input p-channel MOSFET p3 and cross-coupled p-channel MOSFET p2, are connected in series with cross-coupling between the pairs so that one pair is deactivated to an OFF state when the other pair is activated to an ON state.

Figure 5:
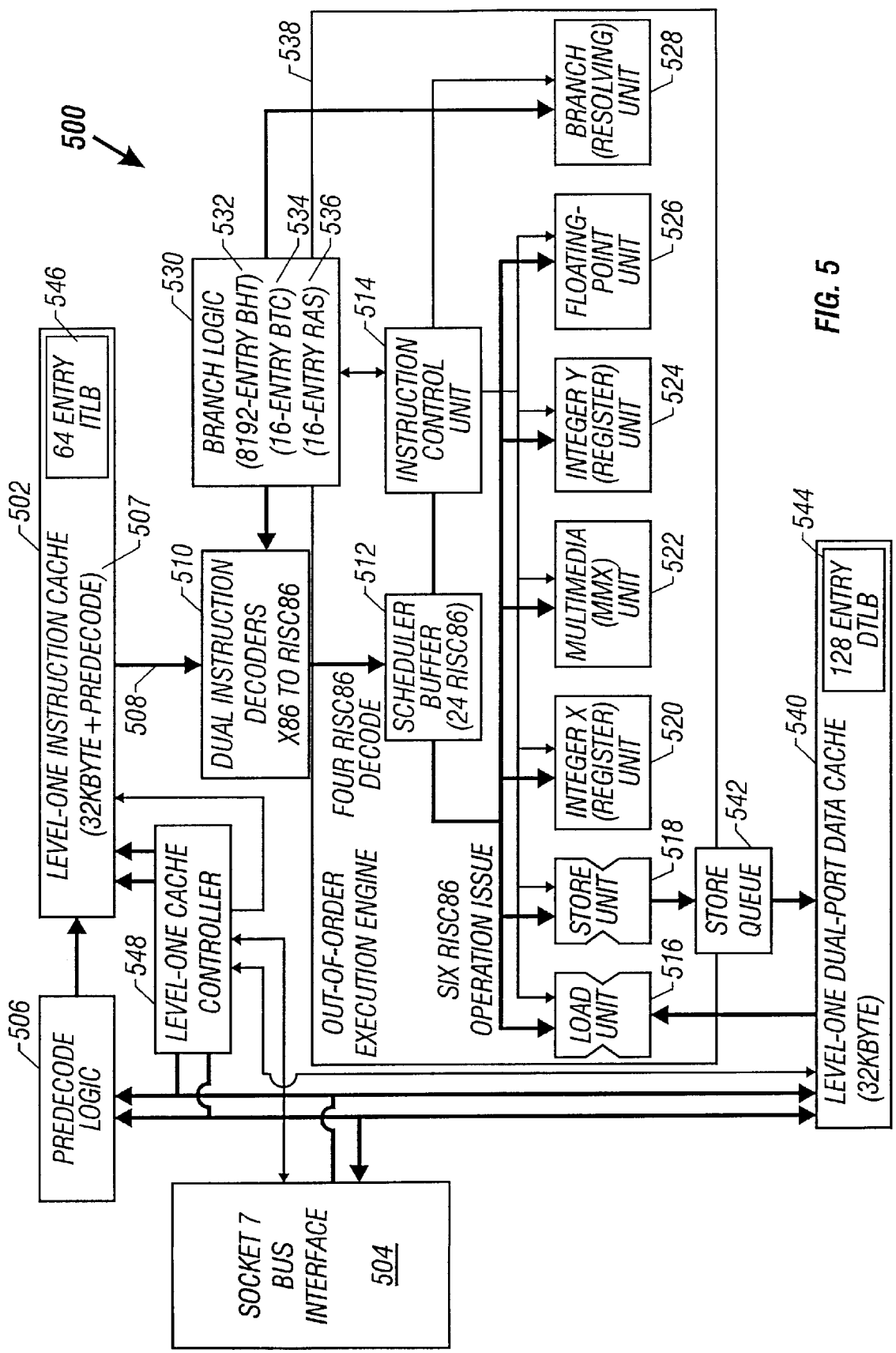
FIG. 5 is an architectural block diagram which illustrates an embodiment of a microprocessor in accordance with an embodiment of the present invention.

Referring to FIG. 5, a schematic block diagram illustrates an embodiment of an AMD-K6 microprocessor 500. The microprocessor 500 is an X86 instruction set-compatible microprocessor implementing a set of Multi-Media eXtenstions (MMX). A level-one (L1) instruction cache 502 begins predecoding instructions obtained from a processor system bus interface 504 during filling of the 32 KB two-way associative L1 instruction cache 502. The L1 instruction cache 502 includes a 64-entry instruction translational lookaside buffer (ITLB) 546. Bypass (not shown) and storage buffers (not shown) for instructions (4×16) and predecode (4×20) to the L1 instruction cache 502 are supplied to allow data-in and data flow-back to cache out-put terminals.

A level-one cache controller 548 controls caching in the L1 instruction cache 502. The L1 instruction cache 502 uses a Most Recently Used (MRU) prediction technique to predict the way selection on cache accesses. A misprediction in the way selection results in a penalty of one cycle. The L1 instruction cache 502 line replacement algorithm is Least Recently Used (LRU) although an alternative random replacement algorithm is supported using an SR5.ICERLR configuration bit. The L1 instruction cache 502 also supports a direct-mapped replacement algorithm, reducing the cache size from 32 KB to 16 KB, using an SR5.ICDM configuration bit.

The L1 instruction cache 502 performs a simple prefetching algorithm. When a line miss occurs, as distinguished from a sub-block miss, and the miss occurs on sub-block 0 of the line (bit[5] of the address is 0), then both sub-blocks are fetched and pipelined on the bus.

The microprocessor 500 includes predecode logic 506 and a predecode cache 507 to identify instruction boundaries and fill the L1 instruction cache 502. Once the L1 instruction cache 502 is filled, predecode bits are stored in the 20 kB predecode cache 507. Predecode bits resolved during the predecoding operation are stored in a 20 KB predecode cache 507. Predecode logic 506 includes a first stage of instruction decode logic. Data from the L1 instruction cache 502 are fetched by fetch logic 508 and transferred to dual instruction decoders 510. The dual instruction decoders 510 decodes up to two X86 instructions per clock and translates most instructions through a direct hardware decode operation into from one to four RISC-like operations, called RISC86 Ops. The hardware-decoded instructions are generally simple and common-type instructions. Other complex or uncommon instructions are mapped into ROM-resident sequences of RISC Ops using emulation code ROM translation.

Decoded instructions from the dual instruction decoders 510 are transferred to a RISC86 Op Scheduler and buffer 512. The RISC86 Op Scheduler 512 holds up to 24 RISC Ops and stores a total of 48 registers using register renaming. The Scheduler 512 contains logic to track instructions from decode to retirement, determining dependencies, scheduling execution, and committing architectural state. The Scheduler 512 is structured as a FIFO queue with instructions entering the queue four at one time to match the macroinstruction decoder bandwidth and up to four instructions retiring at one time at the end of the queue. Instructions enter the Scheduler 512 after decoding or fetching and remain in the scheduler queue until retirement. The Scheduler 512 queue is a general structure for usage for all categories of instructions and thus serves to hold instructions directed to different execution units. The Scheduler 512 utilizes implicit register renaming, which is based on position within the queue rather than explicit tag assignments, so that the Scheduler 512 avoids usage of fill renaming hardware.

The Scheduler 512 manages creation and termination of operands using a hardware structure that is similar to a carry tree of a binary adder to improve speed performance, generating a carry bit for each operand while a most recent retiring or writing operation for a register terminates the carry bit. If a carry is made into a RISC86 Op and the destination of the RISC86 Op matches the operand, then that RISC86 Op is selected to supply the operand. The carry tree structure creates group generate Ggrp[7:0] and group propagate Pgrp[7:0] terms 3-RISC86 Op groups. The selection of 3-RISC86 Op groups is convenient since 24 RISC86 Ops are allocated in the Scheduler 512. The eight group terms are combined in a three-level tree to create a group carry in terms Cgrp[7:0]. The group carry terms Cgrp[7:0] are used within each group to select the operand source Op.

The RISC86 Op Scheduler 512, under control of an instruction control unit 514, issues up to six RISC86 Operations using out-of-order issuing to seven parallel execution units. The execution units speculatively execute the RISC86 Ops to generate results. The RISC86 Op Scheduler 512 retires the results in-order. The execution units include a load unit 516, a store unit 518, an integer X register unit 520, a Multi-Media eXtension (MMX) unit 522, an integer Y register unit 524, a floating-point unit (FPU) 526, and a branch resolving unit 528. A branch logic unit 530 implements a branch prediction operation that uses two-level branch prediction based on an 8192-entry Branch History Table (BHT) 532, a 16-entry Branch Target Cache (BTC) 534, and a 16-entry Return Address Stack (RAS) 536.

The dual instruction decoders 510 translate X86 instructions on-the-fly into corresponding RISC86 Ops. The RISC86 Ops are executed by an instruction core 538 that is essentially a RISC superscalar processing engine. The fetch logic 508 fetches up to sixteen instruction bytes each cycle from the L1 instruction cache 502 and transfers the instruction bytes into an instruction buffer (not shown) preceding the dual instruction decoders 510 so that the instruction buffer is maintained at capacity. The dual instruction decoders 510 accesses the instruction bytes from the instruction buffer, decodes up to two X86 instructions, immediately recognizes and predicts branches, and generates up to four RISC86 Ops. The RISC86 Ops are loaded into the unified RISC86 Op Scheduler 512. The RISC86 Op Scheduler 512 controls and tracks multiple aspects of RISC86 Op issue and execution.

The microprocessor 500 executes up to six operations per clock. Each cycle up to six RISC86 Ops are issued and executed in a pipelined manner. The six RISC86 Ops may include one memory read operation, one memory write operation, two integer and/or one multi-media register operation, one floating point operation, and one evaluation of a branch condition. The RISC86 Ops are executed out-of-order and are executed subject principally to actual dependencies and resource constraints. One example of a resource constraint is that a maximum of two integer register operations (RegOps) is executed per cycle. Once execution of the RISC86 Ops is complete, the RISC86 Op Scheduler 512, functioning as a reorder buffer, commits the RISC86 Ops in-order to ensure precise exception handling and fill operational compatibility with X86 architecture standards. The RISC86 Op Scheduler 512 performs implicit register renaming based upon position within the scheduler buffer (queue) rather than explicit tag assignments that are conventionally employed in systems that use a reorder buffer. The position-based register renaming reduces the size of renaming hardware. The RISC86 Op Scheduler 512 has a first-in-first-out (FIFO) buffer physical structure and performs implicit register renaming, characteristics which, in combination, advantageously permit the use of fast position-based instruction issue and dependency-tracking logic. The dependency-tracking logic has characteristics of many fast adder circuits in which the process of searching for a particular operand is similar to the arithmetic operation of propagating a carry through an adder.

The load unit 516 loads data via a level-one (L1) dual-port data cache 540 which receives data from an external memory (not shown) via the processor system bus interface 504. Bypass (not shown) and storage buffers (not shown) for data (4×16) to the data cache 540 are supplied to allow data-in and data flow-back to cache output terminals.

The data cache 540 includes a 128-entry data translational lookaside buffer (DTLB) 544. The data cache 540 is a 2-way set-associative, 32 KB size cache with a 64 byte line-size and 32-byte sub-blocking. The data cache 540 fills on the basis of the 32-byte sub-block units. In contrast to the L1 instruction cache 502, the data cache 540 uses a Least Recently Missed (LRM) selection technique which is generally a more accurate way selection scheme than the LRU technique of the L1 instruction cache 502. In the LRM scheme, the line that first enters the cache is replaced. An alternative random replacement algorithm is supported and activated through usage of a SR5.DCERLR configuration bit. The data cache 540 also supports a direct-mapped replacement algorithm, reducing the cache size from 32 KB to 16 KB, using an SR5.DCDM configuration bit.

The data cache 540 supports write allocation, which is disabled by setting an SR5.WAD configuration bit. Write allocation is allowed when caching is enabled through miscellaneous cache enable/disable bits and either of two conditions is true. A first condition is that a write operation hits on a line but misses on the requested sub-block. The second condition is that a write operation missed on a line but hit on a one-page cacheability control register used specifically on write-allocate operations. The cacheability control register is invalidated during RESET, translation lookaside buffer invalidations, or cache invalidations initiated by an INVD/WBINVD instruction. Snoop invalidations do not affect the cacheability control register. The cacheability control register is updated/validated on every fill with the page address of the line that was filled into the cache upon initiation by a load operation. Another cacheability control register is validated on write operations to the bus when the writes are determined to be cacheable.

The data cache 540 supports one read operation and one write operation on each cycle to either independent or dependent addresses. Stalls occur on cache misses or when a data dependency occurs that is not handled by hardware. For example, a stall takes place upon the occurrence of a read operation with a superset dependency on an older write operation that has not yet been cached. A superset dependency is defined as a read operation that requests more bytes than a write operation can supply. Address dependencies are detected by monitoring the number of requested bytes and a limited number of address bits (address bits [9:0]) due to timing constraints so that false dependencies may be detected, resulting in unnecessary stalls.

The store unit 518 transfers data to the data cache 540 through a store queue 542.

The MMX unit 522 is implemented to incorporate an X86 instruction subset called the Multi-Media eXtensions (MMX) thereby supporting a growing number of applications in the areas of communications and multimedia. The MMX unit 522 supports the new instructions and the new data types that are defined by the MMX standard to increase processor performance in the targeted applications. The MMX unit 522 executes a Single Instruction, Multiple Data (SIMD) technique to process multiple operands of 8, 16, or 32 bits in a 64-bit data path to perform highly parallel and computationally intensive algorithms that are typical for multimedia applications. The MMX unit 522 supports 57 new instructions that execute additions, subtractions, multiplies, multiply-accumulates, logical shifts, arithmetic shifts, and several other operations. Most operations are executed on operands of any data type.

Referring to FIG. 6, a schematic block diagram illustrates an embodiment of a programmable logic array (PLA) 600 or storage within the floating-point unit (FPU) 526 of the microprocessor 500. The numeric processor PLA 600 contains 17 inputs, 800 minterms, and 104 outputs. The PLA 600 contains an AND array 606, an OR array 610, and respective AND sense amplifiers 620 and OR sense amplifiers 634, in which all arrays and sense amplifiers are differential. A partial transistor having a drain but no source supplies a matched capacitive environment for dummy bit lines. Access time is sacrificed by using contact programming instead of diffusion programming to allow programming changes later in the manufacturing process. The PLA 600 uses self-resetting circuit techniques and has a simulated clock to output delay of 2.5 ns driving a 0.6 pf load.

While the PLA 600 is a circuit within the FPU 526, which is primarily latch-based numerical processor with non-overlapping, dual-phased clocks, the PLA 600 is driven by only a single clock, PH1. Timing of the PLA 600 is similar to the timing of a flip-flop. The PLA 600 has seventeen data input bits that are input to input buffers 602 and evaluated on the rising edge of the PH1 clock. The PLA 600 has 104 data output bits that become valid and are latched 2.5 nanoseconds later by output latches and output buffers 604 driving 0.6 pf under standard timing conditions. The PLA 600 includes a programming capacity of 800 product terms, of which 760 are used. The PLA 600 includes an AND array 606 and an OR array 610 using AND/OR logic that is actually implemented in the PLA 600 as NOR/NOR logic.

The AND array 606 is folded into quarters 612, 614, 616, and 618, advantageously quadrupling the number of input buffers, reducing the capacitance and length of the complementary input-terms driven by each input buffer 602, and improving speed. The AND array 606 includes 800 AND sense amplifiers 620 with 200 allocated to each of the quarters 612, 614, 616, and 618 in respective AND Sense Amps and OR array drivers 622, 624, 626, and 628.

The OR array 610 is folded into halves 630 and 632. The OR array 610 includes 208 OR sense amplifiers 634 with 104 allocated to each of the halves 630 and 632 in respective OR Sense Amps 636 and 638. The result of the OR array 610 is stored in 208 latches and summed into a single bank of 104 output buffers in output latches and output buffers 604. Folding the OR array 610 advantageously doubles the number of OR array 610 sense amplifiers, reduces the bit line capacitance of a sub-term, and improves speed.

Speed performance of the AND array 606 and OR array 610 is improved by precharging and differential sensing of the arrays. The layout technique called bit line twisting with fully differential bit lines is used in both the AND array 606 and the OR array 610 to supply greater margin against the effects of stray bit line coupling in the PLA 600, making the coupling a common mode coupling. The bit line twisting technique achieves a substantial improvement over conventional single-ended bit lines. A single-ended bit line has severe coupling problems because a programmable logic array, unlike a ROM, is subject to multiple pull-downs on a bit line, resulting in a large voltage excursion on adjacent bit lines and generating a large coupling on a victim bit line.

A bit line (not shown) and a bit-bar-line (not shown) are sensed differentially, but are programmed identically rather than complementarily. Programming both the AND array 606 and the OR array 610 is implemented through a contact layer which connects the appropriate bit line metal to the drain of a N-channel memory cell. Access time and layout size are sacrificed by using contact programming instead of another method, such as diffusion programming, to allow code changes later in the manufacturing process.

During evaluation, the logic signal level of a bit line and bit-bar-line both fall when programmed and selected by a wordline, but the bit line and bit-bar-line signals fall at different rates. The capacitance of a bit line and bit-bar-line is programmed to the same value, but the memory cell drive strength is different. The bit line has memory cells that pull down while the bit-bar-line has memory cells that do not pull down.

A bit-bar-line is contact-programmed to match a bit line, so that programming of the bit-bar memory cell supplies the same capacitive load onto the bit-bar-line that the programmed bit memory cell supplies to a bit line. Specifically, the bit-bar memory cell matches the drain-to-bulk and gate-to-drain overlap capacitance of the bit cell, and also matches wiring parasitics. The bit-bar memory cell is a partial transistor, herein called a PLACAP, which is best characterized as a matched dummy N-channel with no source. A row of the AND array 606 or the OR array 610 is programmed to a particular bit line pair by connecting the drain of a transistor on the true bit line and connecting a PLACAP on the complementary bit line. The transistors and PLACAPs are connected or not connected through a contact 1 mask layer for late definition. A half-strength cell pulls down each complement bit line which is then compared to a corresponding true bit line. A bit memory cell pulls down a bit line, but a sourceless bit-bar memory cell does not pull down the bit-bar-line. The bit-bar memory cell is constructed so the channel is incomplete and the diffusion emerges from under only the drain side of the gate but not the source side. Accordingly neither a source diffusion nor a source connection is formed.

If no memory cells are selected in an evaluation cycle, the bit line does not fall. Instead a half strength memory cell which is hard-wired to each bit-bar-line pulls down the bit-bar-line at approximately half the worst case rate of a bit line. Thus the bit-bar-line falls faster and is sensed to have the lower voltage.

The operation and sense amplifier design of the AND Sense Amps and OR array drivers 622, 624, 626, and 628 differ from the operation and design of the sense amplifiers in the OR Sense Amps 636 and 638. In the AND Sense Amps and OR array drivers 622, 624, 626, and 628, the bit or bit-bar side with the faster fall rate triggers the AND-array sense-amp and determines whether a product-term remains in the deselected state of precharge, or is selected. The OR Sense Amps 636 and 638 are triggered by a timed delay-line, then sense the voltage difference between bit line and bit-bar-line to determine the result of the sum-term.

A control input signal applied to quad control blocks 640 disables the PLA 600 to invoke a low power operating mode while the clock continues to run and the input signals change with each clock cycle. During a low power operating mode the PLA 600 ignores the data inputs and clock signals, and retains a latched output data.

Additional control input signals applied to the quad control blocks 640 trim a timing delay line (not shown) that triggers the OR Sense Amps 636 and 638, allowing read-margin testing.

The 208 output latches in the output latches and output buffers 604 form a scan chain in a test mode. When the PH1 clock stops, the PLA 600 output results are serially shifted out through a test pin (not shown), or substitute data is serially shifted into the PLA 600 output latches to overwrite the data output of the PLA 600.

Figure 7:
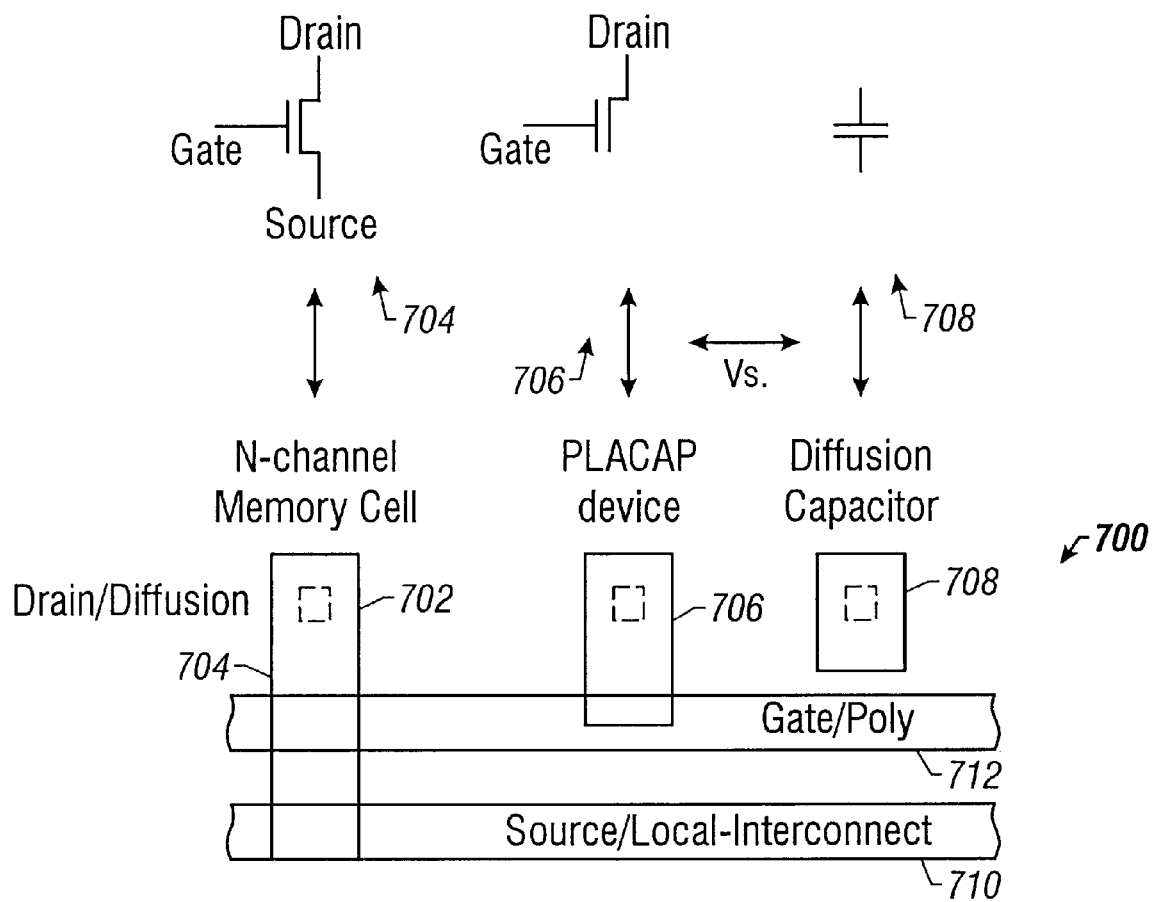
FIG. 7 is a schematic circuit diagram illustrates an interconnect structure which is suitable for usage in the AND array and the OR array.

Referring to FIG. 7, a schematic circuit diagram illustrates an interconnect structure 700 which is suitable for usage in the AND array 606 and the OR array 610. The interconnect structure 700 includes a source/local interconnect 710 and a gate/polysilicon interconnect layer 712. The interconnect structure 700 includes interconnects for connecting to a drain/diffusion 702 in the case of an N-channel transistor memory cell 704 and a PLACAP device 706. The PLACAP device 706 is used preferentially over a diffusion capacitor 708 which is also shown in FIG. 7.

The PLACAP device 706 is used to supply capacitive matching between true and complement bit lines. The PLACAP device 706 is selected with preference over a grounded gate transistor because an array element formed by the grounded gate transistor is substantially larger than a PLACAP device 706 array element. The PLACAP device 706 is selected with preference over the diffusion capacitor 708 because the diffusion does not have a matching drain-gate overlap Miller capacitance. The PLACAP device 706 advantageously has a substantially improved precision matching which permits fabrication of storage arrays that are at least two times larger than arrays constructed using diffusion capacitors 708 when the devices are toleranced over all simulation corners.

Figure 8:
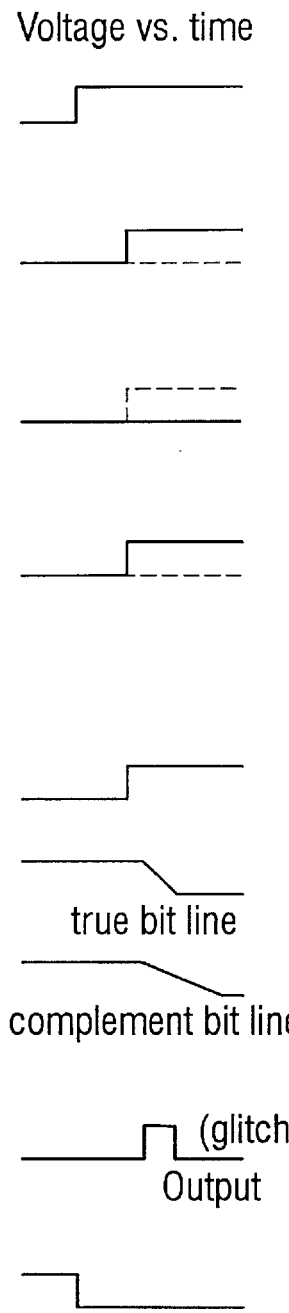
FIG. 8 is a schematic circuit and associated-signal timing diagram illustrating an embodiment of a non-strobed AND array sense amplifier.
Figure 8:
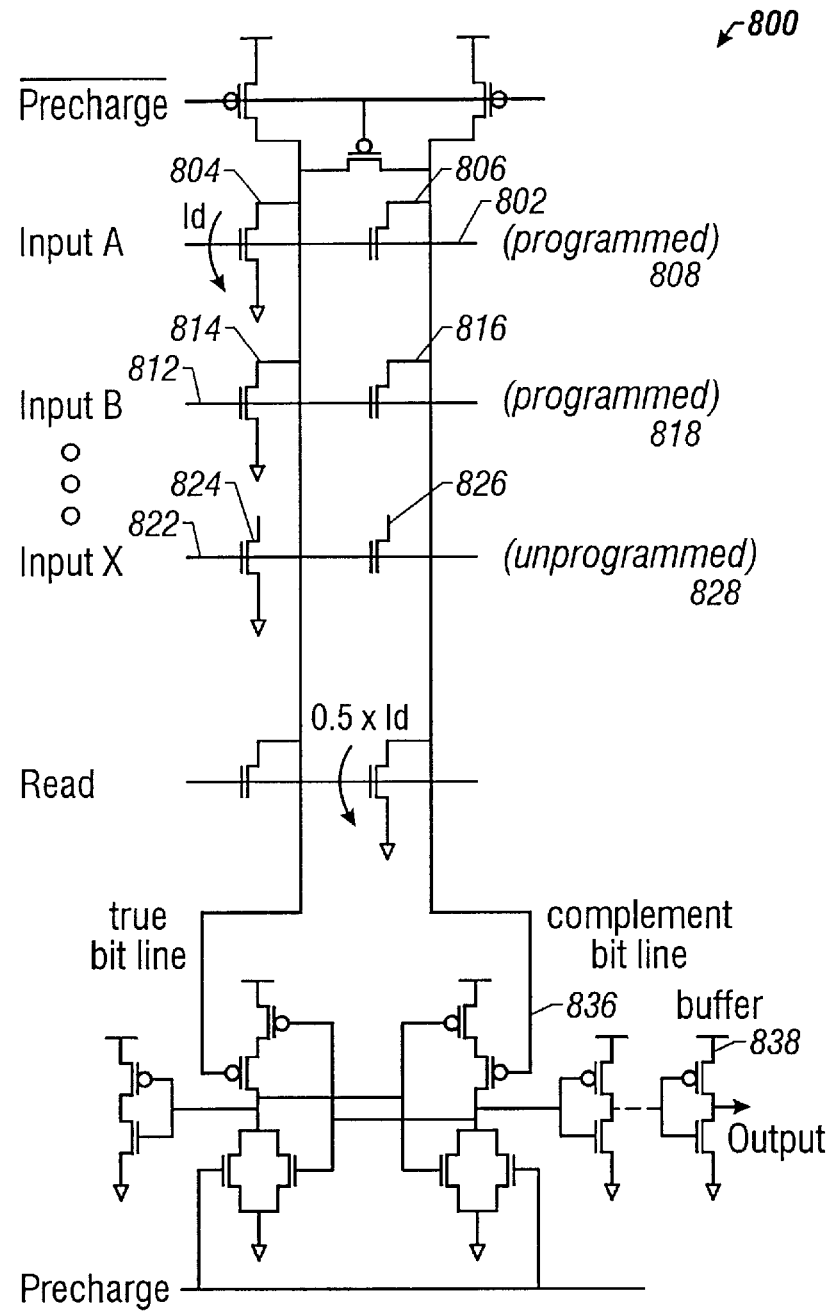

Referring to FIG. 8, a schematic circuit and associated-signal timing diagram illustrates an embodiment of a non-strobed AND array sense amplifier 800. The non-strobed AND array sense amplifier 800 exploits the very fast operating speed that results from having short bit lines in the AND array 606 so that the modest speed improvement gained by strobing the sense amplifier is not sought. The non-strobed AND array sense amplifier 800 is depicted which has an input signal A 802 controlling a transistor 804 and PLACAP 806 of a programmed cell 808 and an input signal B 812 controlling a transistor 814 and PLACAP 816 of a programmed cell 818. The non-strobed AND array sense amplifier 800 also has an input signal X 822 controlling a transistor 824 and PLACAP 826 of an unprogrammed cell 828. The non-strobed AND array sense amplifier 800 has a read line connected to a read cell 830 including a transistor 832 and PLACAP 834. The non-strobed AND array sense amplifier 800 has a nonstrobed output driver 836 and an output buffer 838. Timing diagrams illustrate a precharge signal, the inverse precharge signal, input signals A, B, . . . , and X, the read signal, true and complement bit line signals, and the output signal.

Figure 9:
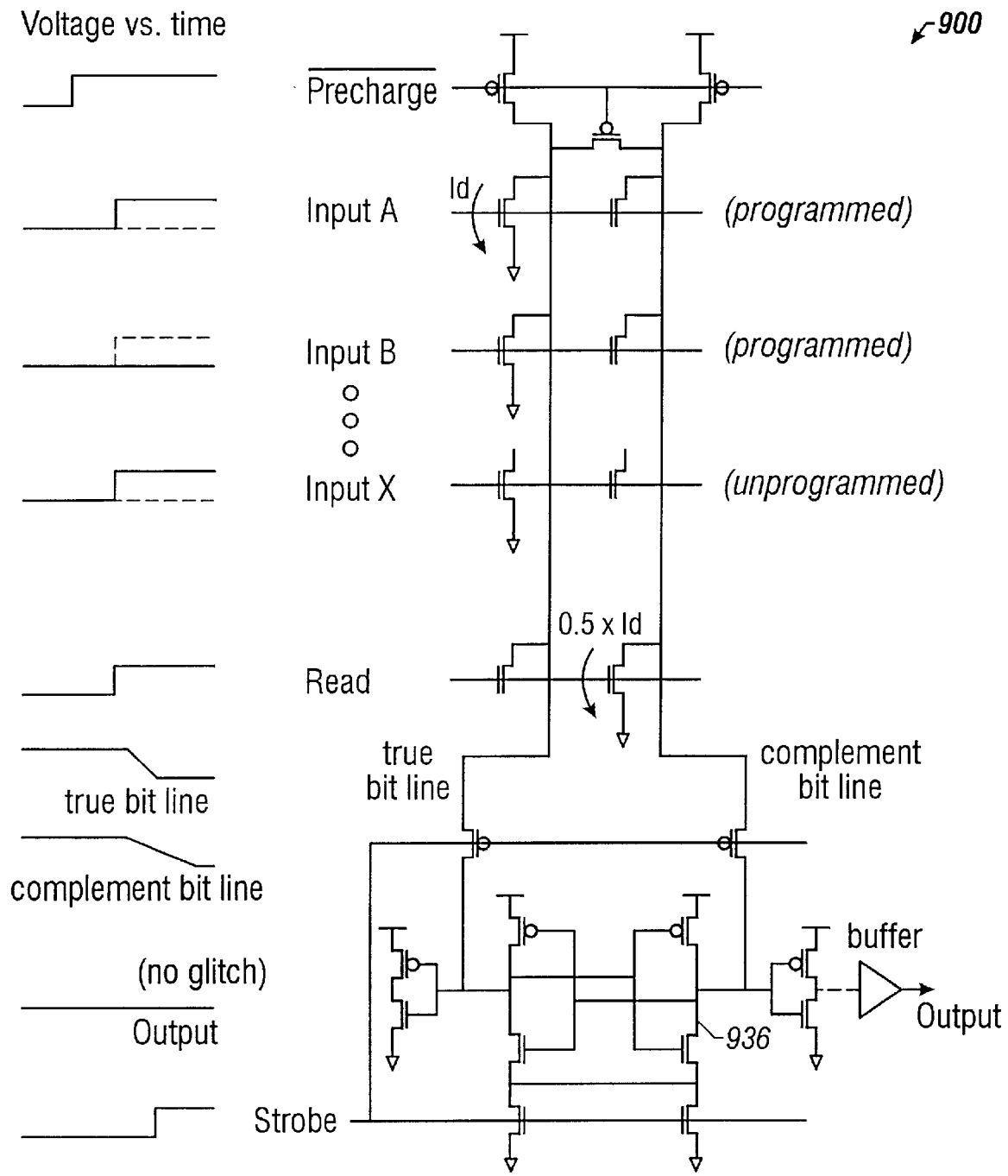
FIG. 9 is a schematic circuit and associated-signal timing diagram illustrating an embodiment of a strobed AND array sense amplifier.

One problem with the non-strobed AND array sense amplifier 800 is that, for some fabrication processes, glitches are generated at the output terminal of the array sense amplifier 800. The glitches result from the true bit lines and the complement bit lines falling very fast relative to the response time of the sense amplifier. Referring to FIG. 9, a schematic circuit and associated-signal timing diagram illustrates an embodiment of a strobed AND array sense amplifier 900 that cures the problem of output signal glitches by usage of a self-timed, strobed output driver 936. Usage of the strobed AND array sense amplifier 900 advantageously avoids output signal glitches and improves access time of the program logic array (PLA) 600.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

For example, although the differential comparator is depicted in the application of a programmable logic array (PLA), the differential comparator may be used in many other applications. In one example, the differential comparator operates as a comparator in a cache for comparing entries in a translation lookaside buffer (TLB) to entries in a tag RAM to determined whether a selected data or instruction block is present in the cache.

Similarly, although the differential amplifier is shown used in the application of a differential comparator of a programmable logic array (PLA), the differential amplifier may be used in other applications such as a comparator circuit in a cache for comparing entries in a tag RAM to entries in a translational lookaside buffer to determine whether a string of storage elements is presently contained in the cache.

What is claimed is:

1. A comparator comprising:
   a first line and a second line;
   a plurality of individual-bit comparison devices coupled to the first line;
   a timing device coupled to the second line;
   a differential amplifier having a first input terminal coupled to the first line, a second input terminal coupled to the second line; and
   a balance capacitor coupled to the second line.

2. A comparator according to claim 1, further comprising:
   a precharge control line coupled to the first line and coupled to the second line.

3. A comparator according to claim 1, wherein:
   an individual-bit comparison device of the individual-bit comparison devices is a pair of transmission gates coupled to a pulldown transistor.

4. A comparator according to claim 1, wherein:
   an individual-bit comparison device of the individual-bit comparison devices is a pair of transmission gates coupled to a pulldown transistor, the pulldown transistor having a channel width.

5. A comparator according to claim 4, wherein:
   the timing device is a pulldown transistor controlled by a timing signal replicating the timing of a signal driving the individual-bit comparison devices, the timing device having a channel width less than the channel width of the individual-bit comparison device so that the timing device has a slower response than the individual-bit comparison device.

6. A comparator according to claim 4, wherein:
   the timing device is a pulldown transistor controlled by a timing signal replicating the timing of a signal driving the individual-bit comparison devices, the timing device having a transistor approximately half or less than the channel width of the individual-bit comparison device so that the timing device has a slower response than the individual-bit comparison device.

7. A comparator according to claim 1, wherein:
   the amplifier is a differential, nonstrobed sensed amplifier.

8. A comparator comprising:
   a first line and a second line;
   a plurality of individual-bit comparison devices coupled to the first line;

a timing device coupled to the second line, the timing device being a pulldown transistor controlled by a timing signal replicating the timing of a signal driving the individual-bit comparison devices; and a differential amplifier having a first input terminal coupled to the first line, a second input terminal coupled to the second line.

9. A comparator comprising:

a first line and a second line;

a plurality of individual-bit comparison devices coupled to the first line;

a timing device coupled to the second line; and a differential amplifier having a first input terminal coupled to the first line, a second input terminal coupled to the second line, the amplifier being a differential, strobed sense amplifier.

10. A comparator comprising:

a first line and a second line;

a plurality of individual-bit comparison devices coupled to the first line;

a timing device coupled to the second line; and a differential amplifier having a first input terminal coupled to the first line, a second input terminal coupled to the second line, the amplifier being a differential, nonstrobed sense amplifier having paired symmetric first and second cross-coupled devices, the first and second cross-coupled devices are arranged in a mutually opposing configuration and each includes a first transistor, a second transistor, and a third transistor connected in series and having a common source-drain pathway, a node being coupled between the second and third transistors;

the first transistor in each of the first and second cross-coupled devices having a gate terminal connected to a line of the first and second lines; and the second transistor in each of the first and second cross-coupled devices having a gate terminal connected to the node of the mutually opposing cross-coupled device.

11. A comparator according to claim 10, wherein:

the first and second transistors of the paired symmetric first and second cross-coupled devices are p-channel MOSFETs; and the second transistor of the paired symmetric first and second cross-coupled devices is an n-channel MOSFET.

12. A comparator according to claim 10, wherein:

the sense amplifier further includes for the paired symmetric first and second cross-coupled devices:

a precharge transistor sharing the source-drain pathway of the third transistor and a gate coupled to a precharge line.

13. A comparator according to claim 12, wherein:

the first and second transistors of the paired symmetric first and second cross-coupled devices are p-channel MOSFETs; and the second transistor and the precharge transistor of the paired symmetric first and second cross-coupled devices is an n-channel MOSFET.

14. A storage comprising:

a plurality of differential comparators including:
  a first line and a second line;
  a plurality of individual-bit comparison devices coupled to the first line;
  a timing device coupled to the second line;
  a differential amplifier having a first input terminal coupled to the first line, a second input terminal coupled to the second line; and
  a balance capacitor coupled to the second line.

15. A storage according to claim 14, the plurality of differential comparators further comprising:

a precharge control line coupled to the first line and coupled to the second line.

16. A storage according to claim 14, wherein:

an individual-bit comparison device of the individual-bit comparison devices is a pair of transmission gates coupled to a pulldown transistor.

17. A storage according to claim 14, wherein:

an individual-bit comparison device of the individual-bit comparison devices is a pair of transmission gates coupled to a pulldown transistor, the pulldown transistor having a channel width.

18. A storage according to claim 17, wherein:

the timing device is a pulldown transistor controlled by a timing signal replicating the timing of a signal driving the individual-bit comparison devices, the timing device having a channel width less than the channel width of the individual-bit comparison device so that the timing device has a slower response than the individual-bit comparison device.

19. A storage according to claim 17, wherein:

the timing device is a pulldown transistor controlled by a timing signal replicating the timing of a signal driving the individual-bit comparison devices, the timing device having a channel width approximately half or less than the channel width of the individual-bit comparison device so that the timing device has a slower response than the individual-bit comparison device.

20. A storage according to claim 14, wherein:

the amplifier is a differential, nonstrobed sensed amplifier.

21. A storage comprising:

a plurality of differential comparators including:
  a first line and a second line;
  a plurality of individual-bit comparison devices coupled to the first line;
  a timing device coupled to the second line, the timing device being a pulldown transistor controlled by a timing signal replicating the timing of a signal driving the individual-bit comparison devices; and
  a differential amplifier having a first input terminal coupled to the first line, a second input terminal coupled to the second line.

22. A storage comprising:

a plurality of differential comparators including:
  a first line and a second line;
  a plurality of individual-bit comparison devices coupled to the first line;
  a timing device coupled to the second line; and
  a differential amplifier having a first input terminal coupled to the first line, a second input terminal coupled to the second lines, the amplifier being a differential, strobed sense amplifier.

23. A storage comprising:

a plurality of differential comparators including:
  a first line and a second line;
  a plurality of individual-bit comparison devices coupled to the first line;
  a timing device coupled to the second line; and
  a differential amplifier having a first input terminal coupled to the first line, a second input terminal coupled to the second line, the amplifier being a differential, nonstrobed sense amplifier having paired symmetric first and second cross-coupled devices, the first and second cross-coupled devices are arranged in a mutually opposing configuration and each includes a first transistor and a second transistor connected in series and having a common source-drain pathway, and a third transistor cross-coupled to the first and second transistors, a node being coupled between the second and third transistors;

the first transistor in each of the first and second cross-coupled devices having a gate terminal connected to a line of the first and second lines; and the second transistor in each of the first and second cross-coupled devices having a gate terminal connected to the node of the mutually opposing cross-coupled device.

24. A storage according to claim 23, wherein:

the amplifier further includes for the paired symmetric first and second cross-coupled devices:

a precharge transistor sharing the source-drain pathway of the third transistor and a gate coupled to a precharge line.

25. A storage according to claim 24, wherein:

the first and second transistors of the paired symmetric first and second cross-coupled devices are p-channel MOSFETs; and the second transistor and the precharge transistor of the paired symmetric first and second cross-coupled devices is an n-channel MOSFET.

26. A storage according to claim 23, wherein:

the first and second transistors of the paired symmetric first and second cross-coupled devices are p-channel MOSFETs; and the third transistor of the paired symmetric first and second cross-coupled devices is an n-channel MOSFET.

27. A storage according to claim 23, wherein:

the storage includes one or more storage cells of a storage type selected from among a group including programmable logic arrays, memories, read-only memories (ROMs), random access memories (RAMs), and registers.

* * * * *